(12) United States Patent
Nakajo et al.

(10) Patent No.: US 7,728,398 B2
(45) Date of Patent: Jun. 1, 2010

(54) MICRO CAMERA MODULE AND METHOD OF MANUFACTURING THE SAME

(75) Inventors: Hironori Nakajo, Kawasaki (JP); Hiroshi Yoshikawa, Kawasaki (JP); Michio Sasaki, Kamakura (JP); Akihiro Hori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 977 days.

(21) Appl. No.: 11/476,160

(22) Filed: Jun. 28, 2006

(65) Prior Publication Data

US 2007/0019102 A1    Jan. 25, 2007

(30) Foreign Application Priority Data

Jul. 1, 2005    (JP) .............................. 2005-193959

(51) Int. Cl.
*H01L 31/058* (2006.01)
(52) U.S. Cl. ................ 257/432; 257/459; 257/E31.124
(58) Field of Classification Search ................. 257/432, 257/459

See application file for complete search history.

(56) References Cited

U.S. PATENT DOCUMENTS

| | | | |
|---|---|---|---|
| 6,384,397 B1 | 5/2002 | Takiar et al. | |
| 6,607,941 B2 * | 8/2003 | Prabhu et al. | 438/113 |
| 6,646,289 B1 * | 11/2003 | Badehi | 257/81 |
| 6,781,244 B2 * | 8/2004 | Prabhu | 257/778 |
| 7,045,870 B2 * | 5/2006 | Wataya | 257/433 |
| 7,067,354 B2 * | 6/2006 | Prabhu | 438/113 |
| 7,101,735 B2 * | 9/2006 | Noma et al. | 438/114 |
| 7,112,863 B2 * | 9/2006 | Imaoka | 257/432 |
| 7,157,742 B2 * | 1/2007 | Badehi | 257/81 |
| 7,180,149 B2 * | 2/2007 | Yamamoto et al. | 257/434 |
| 7,187,051 B2 * | 3/2007 | Wataya | 257/433 |
| 7,282,696 B2 * | 10/2007 | Matsuyama et al. | 250/226 |
| 7,371,693 B2 * | 5/2008 | Suzuki et al. | 438/745 |
| 2007/0126912 A1* | 6/2007 | De Bruin et al. | 348/340 |

FOREIGN PATENT DOCUMENTS

| | | |
|---|---|---|
| JP | 2001-238103 | 8/2001 |
| WO | WO 2005/041561 A1 | 5/2005 |

\* cited by examiner

*Primary Examiner*—David A Zarneke
(74) *Attorney, Agent, or Firm*—Oblon, Spivak, McClelland, Maier & Neustadt, L.L.P.

(57) ABSTRACT

A semiconductor chip constituting an image pickup device is provided on a substrate and includes a connection terminal and an image pickup portion. A lens sheet having a lens portion is provided on the semiconductor chip. A groove is formed in at least the substrate to expose the connection terminal. A conductor pattern is formed in the groove and has one end electrically connected to the connection terminal.

6 Claims, 4 Drawing Sheets

MICRO CAMERA MODULE AND METHOD OF MANUFACTURING THE SAME

CROSS-REFERENCE TO RELATED APPLICATIONS

This application is based upon and claims the benefit of priority from prior Japanese Patent Application No. 2005-193959, filed Jul. 1, 2005, the entire contents of which are incorporated herein by reference.

BACKGROUND OF THE INVENTION

1. Field of the Invention

The present invention relates to a micro camera module with a lens and a built-in CCD or CMOS sensor and a method for manufacturing the camera module.

2. Description of the Related Art

Micro camera modules usually have, for example, an image pickup sensor, an infrared (IR) cut filter, a substrate, passive parts, an optical lens, and a diaphragm.

In recent years, growing desires have been made to reduce the size of camera modules. The following are important in reducing the size of camera modules.

(1) Reduction in the sizes of a sensor chip and passive parts used
(2) Reduction in the size of pixels for the sensor and in the thickness of an optical system (1) is mainly a reduction in lateral size which can be achieved by improving parts and mounting techniques. In particular, much attention has been paid to a mounting technique using a substrate of the same size as that of the sensor chip, for example, a chip scale package (CSP). On the other hand, (2) is mainly a reduction in vertical size. Normally, optical parts such as an IR cut filter, a diaphragm, and an optical lens need to be stacked on the sensor. This makes it difficult to reduce the thickness.

Jpn. Pat. Appln. KOKAI Publication No. 2001-238103 discloses an image pickup device serving as a camera module. This image pickup device has an image pickup element provided on a substrate and on which an optical element having a coupling lens portion is provided. The image pickup element and the substrate are electrically connected together via wire. The substrate is further sealed with resin so as to expose the coupling lens portion to integrate the substrate, image pickup element, and optical element together.

However, the conventional camera module requires a lens barrel and holder which support the lens, a holder that supports the IR cut filter, a housing that holds the substrate, image pickup element, and optical element, a sealing resin that seals the stack, and the like. Further, the lens barrel and holder, the holder supporting the IR cut filter, the substrate, the image pickup element, and the optical element are separate parts. These parts are very small and difficult to assemble. Furthermore, if these parts are assembled, their sizes and thicknesses cannot be easily reduced to required values. Therefore, it has been desirable to provide a high-performance camera of a reduced size and reduced thickness and a method for manufacturing such a camera.

BRIEF SUMMARY OF THE INVENTION

According to a first aspect of the invention, there is provided an image pickup device comprising: a substrate; a semiconductor chip provided on the substrate and including a connection terminal and an image pickup portion; a lens sheet having a lens portion provided on the semiconductor chip; a groove formed at least in the substrate to expose the connection terminal; and a conductor pattern formed in the groove, one end of the conductor pattern being electrically connected to the connection terminal.

According to a second aspect of the invention, there is provided an image pickup device comprising: a semiconductor chip having a first connection terminal and an image pickup element portion on a front surface, and a second connection terminal on a back surface, the semiconductor chip internally having a conductor that connects the first and second connection terminals together; and a lens sheet having a lens portion provided on the front surface of the semiconductor chip.

According to a third aspect of the invention, there is provided a method for manufacturing an image pickup device, the method comprising: providing a substrate, a semiconductor wafer including a plurality of chips, and a lens sheet having a plurality of lens portions, each of the plurality of chips having an image pickup element portion and a connection terminal; stacking the substrate, the semiconductor wafer, and the lens sheet to form a stacked member, a bonding layer being formed between the substrate and the semiconductor wafer and between the semiconductor wafer and the lens sheet; forming a groove at least in the substrate so that the connection terminals of the plurality of chips are exposed; and dicing the stacked member into chips.

BRIEF DESCRIPTION OF THE SEVERAL VIEWS OF THE DRAWING

FIGS. 3A and 3B are schematic diagrams of the camera module according to the first embodiment, wherein FIG. 3A is a sectional view of the camera module before dicing and FIG. 3B is a sectional view of the camera module after dicing;

DETAILED DESCRIPTION OF THE INVENTION

Embodiments of the present invention will be described with reference to the drawings.

Figure 1:
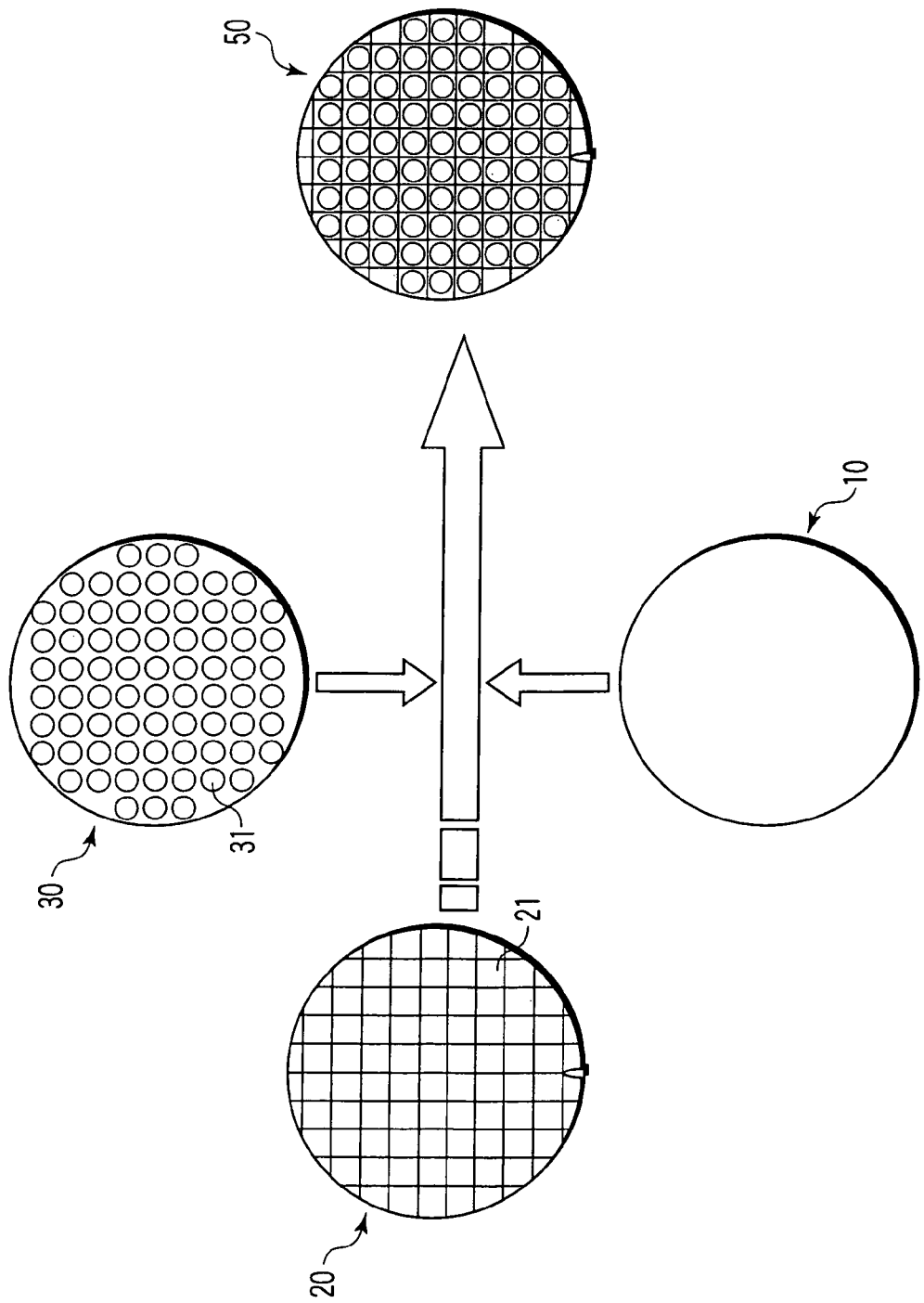
FIG. 1 is a plan view schematically showing a process of manufacturing a camera module according to a first embodiment.
Figure 3A:
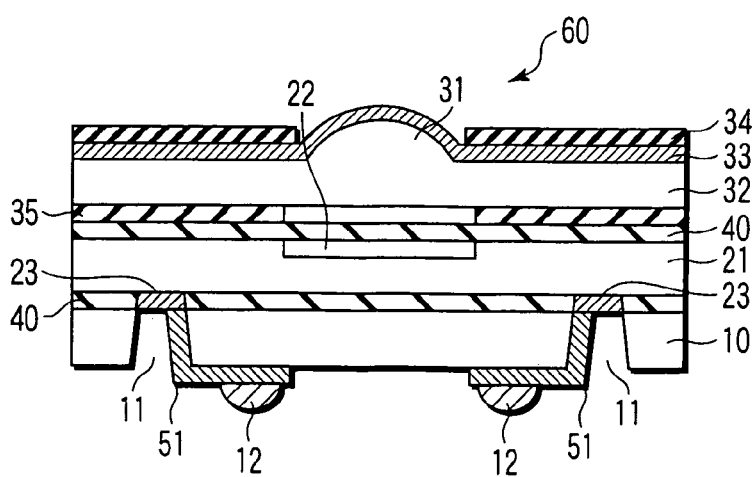
Figure 3B:
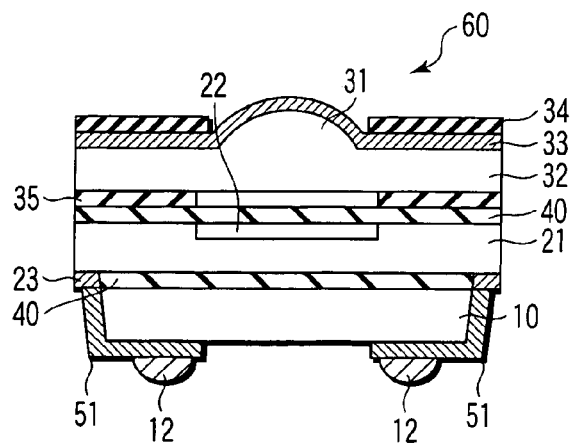
Figure 4:
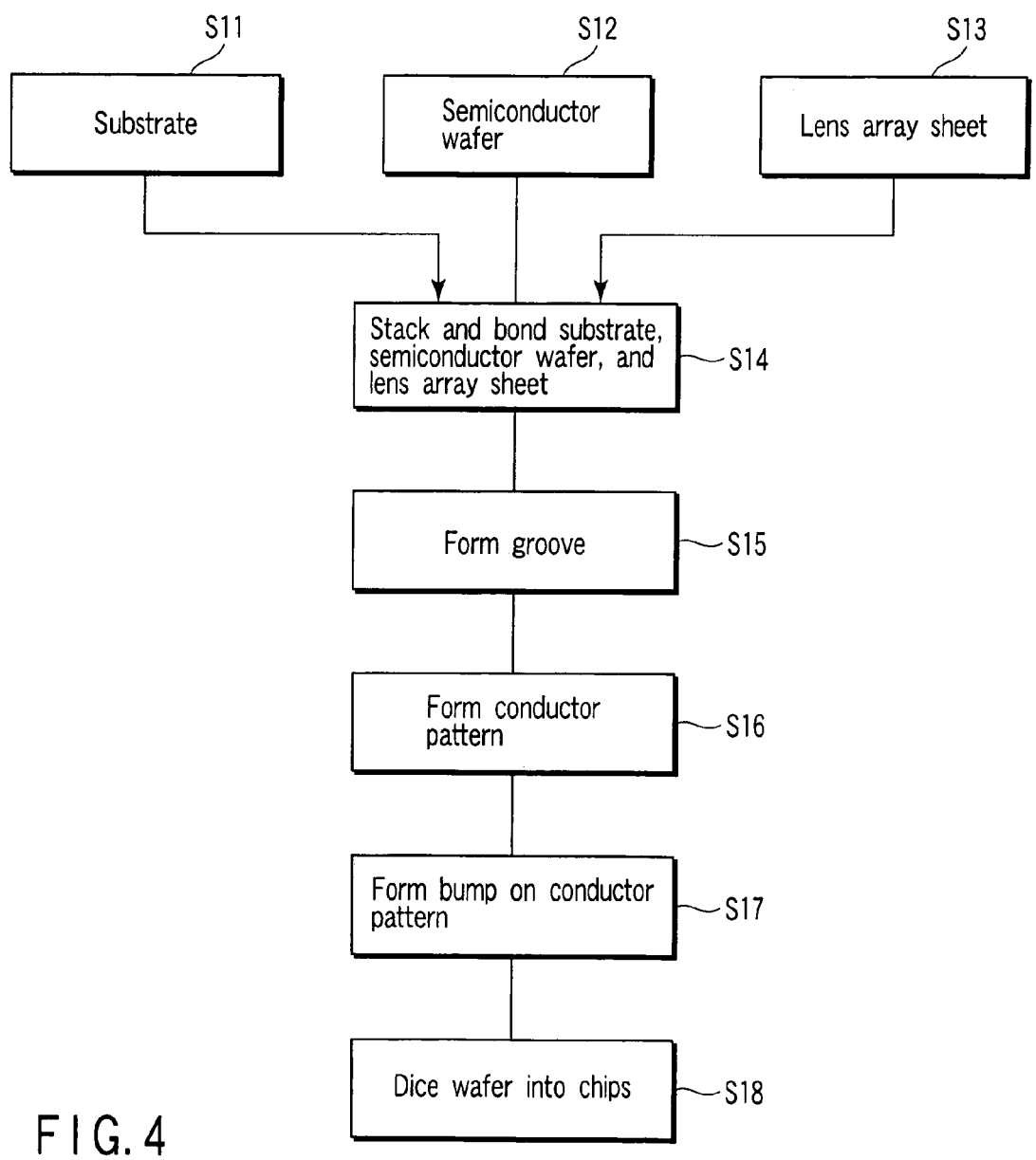
FIG. 4 is a flowchart showing a process of manufacturing the camera module according to the first embodiment.

FIGS. 1 to 4 show a first embodiment of the present invention. First, as shown in FIGS. 1 and 4, a substrate 10, a semiconductor wafer 20, and a lens array sheet 30 are provided (S11, S12, and S13). The substrate 10 is composed of, for example, ceramic, glass, or resin and has almost the same size and diameter as those of the semiconductor wafer.

Figure 2:
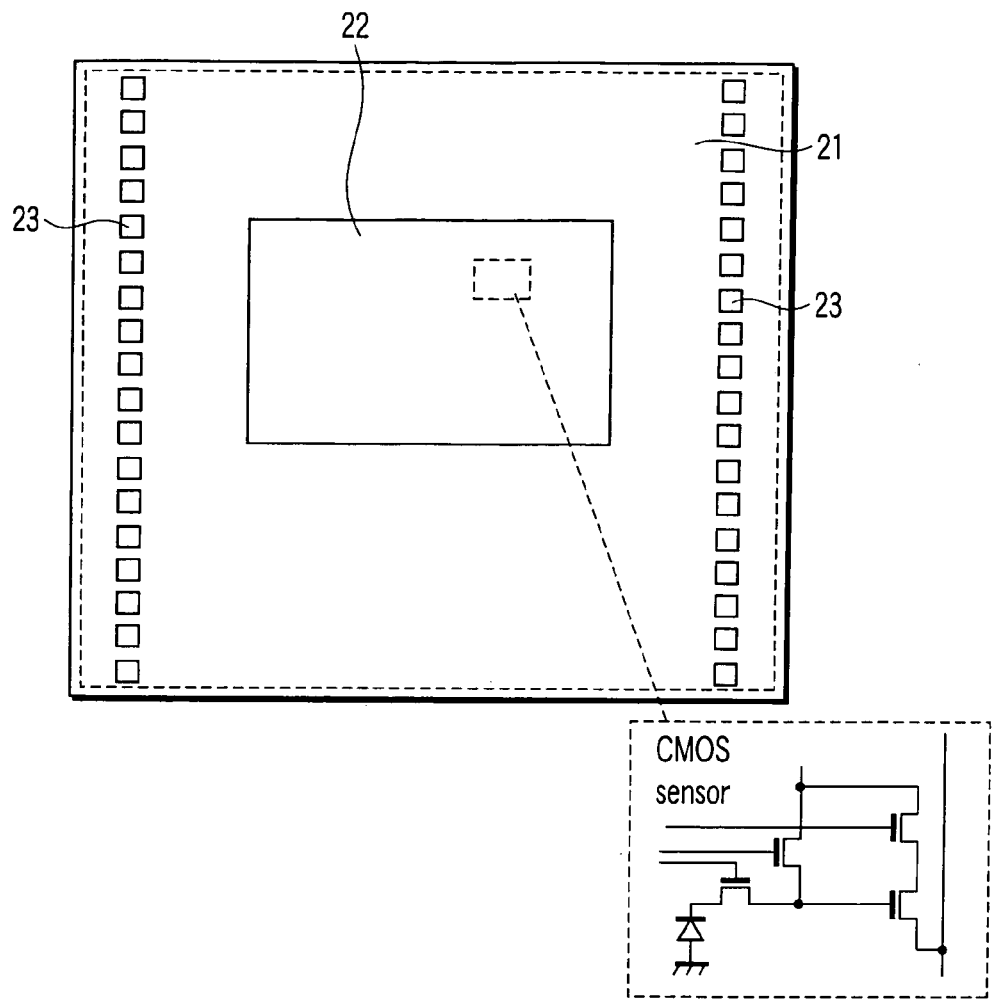
FIG. 2 is a plan view schematically showing a semiconductor chip according to the first embodiment.

The semiconductor wafer 20 is provided with image pickup elements, for example, CCD or CMOS sensors, and a plurality of chips 21 including peripheral circuits for the image pickup elements. FIG. 2 shows a plan view of each chip. A photosensitive pixel area 22 is formed on a front surface of the chip 21 and in almost its central portion. A plurality of connection terminals (electrodes) 23 are formed, for example, on a back surface of the chip 21 and in its peripheral portion.

The lens array sheet 30 has a plurality of image pickup lenses 31 consisting of, for example, convex lenses and serving as a lens portion. The lens array sheet 30 and the image pickup lenses 31 may be formed of the same material or different materials. To form both the sheet and image pickup lens using the same material, the image pickup lenses 31 can be formed on the sheet by molding, etching, deposition, or the like. To form the sheet and image pickup lens 31 using different materials, an optical transparent resin, for example, a phenol resin or acrylic resin may be used to form convex lenses, as image pickup lenses 31, on a front surface of an optical material such as glass or a thermosetting resin or transmissive ceramic. In the lens array sheet 30, the image pickup lenses 31 are arranged in association with the photosensitive pixel areas 22 in the respective chips.

To form an IR cut filter on a front surface of the lens, the IR cut filter may be formed on a front surface of the lens array sheet 30. To form a shielding diaphragm, a shielding film may be formed, by for example, spraying or printing, for example, on the front and/or back surface of the lens array sheet 30 except the areas that correspond to the image pickup lenses 31.

The substrate 10, semiconductor wafer 20, and lens array sheet 30 are bonded in this order via epoxy resin layers 40 serving as bonding layers, to form a stacked member 50 (S14). Specifically, the semiconductor wafer 20 is bonded to the substrate 10 via the epoxy resin layer 40. The lens array sheet 30 is bonded to the semiconductor wafer 20 via the epoxy resin layer 40. Subsequently, as shown in FIG. 3A, a groove 11 with, for example, a V-shaped cross section is formed in association with the connection terminal 23 of each chip 21 (S15). Forming the groove 11 allows the connection terminal 23 of each chip 21 to be exposed in the groove 11.

A plurality of conductor patterns 51 are subsequently formed on a back surface of the stacked member 50, that is, on a back surface of the substrate 10 and sides of the groove 11, by means of, for example, sputtering (S16). One end of each of the conductor patterns 51 is electrically connected to the connection terminal 23 exposed in the groove 11.

A ball bump 12 is then formed on the other end of each conductor pattern 51, that is, a part of the conductor portion 51 which is formed on the back surface of the substrate 10 (S17).

The stacked member 50 is subsequently diced along the center of the groove 11 to complete individual modules, that is, camera modules 60, as shown in FIG. 3B (S18).

FIG. 3B shows the sectional structure of the camera module 60 formed. The camera module is composed of the substrate 10 having the plurality of ball bumps 12, the semiconductor chip 21 provided on the substrate 10 and having the connection terminal 23 exposed from the groove 11, the semiconductor chip 21 also including the photosensitive pixel area 22, the lens sheet 32 provided on the semiconductor chip 21 and having the image pickup lens 31, and the conductor pattern 51 formed on the substrate 10 to electrically connect the connection terminal 23 and the ball bump 12 together.

A shielding film 34 is formed on the entire front surface of the lens sheet 32 except, for example, areas in which the IR cut filter 33 and the image pickup lens 31 are formed. Further, a shielding film 35 is formed on the entire back surface of the lens sheet 30 except a part corresponding to the area in which the image pickup lens 31 is formed.

According to the first embodiment, the semiconductor wafer 20 on which the plurality of chips 21 are stacked is stacked on the substrate 10. The lens array sheet 30 on which the plurality of image pickup lenses 31 are formed is stacked on the semiconductor wafer 20. Under these conditions, the conductive pattern 51 is formed. Dicing is then executed to form a camera module. Thus, in contrast to conventional camera modules, this camera module enables the elimination of the need for a process of assembling individual parts constituting the camera module under individual conditions. This enables a very small, high-performance camera module to be provided through a simple manufacturing process. The first embodiment can also reduce the number of parts required compared to the prior art, this enabling a reduction in the thickness of the camera module.

Figure 5:
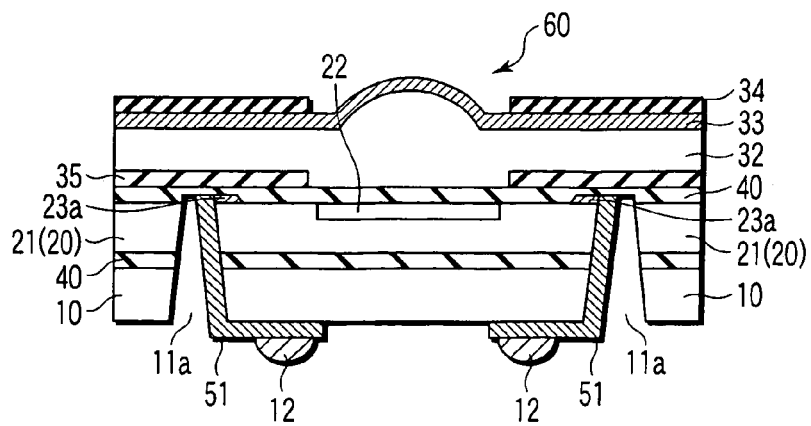
FIG. 5 is a sectional view schematically showing a camera module according to a second embodiment.

FIG. 5 shows a second embodiment in which the same components as those of the first embodiment are denoted by the same reference numerals. In the first embodiment, the connection terminal 23 of each chip 21 is formed on the back surface of the semiconductor wafer 20. In the second embodiment, a connection terminal 23a is formed on the front surface of the semiconductor wafer 20. In this case, a groove 11a is formed in the substrate 10 and semiconductor wafer 20 (chip 21). The connection terminal 23a, formed on the front surface of the semiconductor wafer 20, is exposed in the groove 11a. The conductive pattern 51 is formed so as to extend through the groove 11a to the front surface of the semiconductor wafer 20 to connect to the connection terminal 23a. After the formation, dicing is executed along the center of the groove 11a.

The manufacture method of the second embodiment is similar to that of the first embodiment except the depth of the groove 11 in the manufacture process shown in FIG. 4. The second embodiment can produce effects similar to those of the first embodiment.

Figure 6:
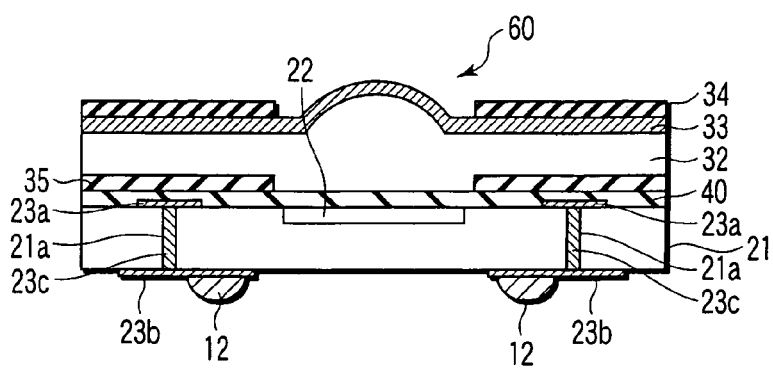
FIG. 6 is a sectional view schematically showing a camera module according to a third embodiment.

FIG. 6 shows a third embodiment in which the same components as those of the first embodiment are denoted by the same reference numerals. In contrast to the first and second embodiments, the third embodiment does not have the substrate 10. In FIG. 6, the semiconductor wafer 20 (chip 21) has the first connection terminal 23a on its front surface and a second connection terminal 23b on its back surface. The second connection terminal 23b is formed at a position corresponding to the first connection terminal 23a. The second connection terminal 23b has a slightly larger area than the first connection terminal 23a. A conductor 23c is formed in the semiconductor wafer 20 to electrically connect the first and second connection terminals 23a and 23b together. The conductor 23c is formed by forming a connection hole 21a in the part of the semiconductor wafer 20 which is located between the first and second connection terminals 23a and 23b and filling the connection hole 21a with, for example, a conductor metal. Alternatively, the conductor 23c is formed by plating the inside of the connection hole 21a with the conductor metal. The ball bump 12 is formed on the second connection terminal 23b.

In the manufacture method of the third embodiment, the step of laminating the semiconductor wafer 20 and lens array sheet 30 together is similar to that in the first embodiment; the step of laminating the substrate 10 in the third embodiment is different from that in the first embodiment. That is, as shown in FIGS. 1 and 4, the semiconductor wafer 20 and lens array sheet 30 are provided. The photosensitive pixel area 22 and the plurality of first connection terminals 23a are formed on the semiconductor wafer 20 for each chip. The connection terminal 23b is formed on the back surface of the semiconductor wafer 20. The conductor 23c is formed in the semiconductor wafer 20. The lens array sheet 30 is bonded to the front surface of semiconductor wafer 20 via the epoxy resin layer 40, serving as a bonding layer, to form a stacked member. The ball bump 12 is then formed on the second connection terminal 23b. Dicing is subsequently executed to complete a camera module.

If the lens array sheet 30 can withstand high-temperature treatments, the following process may be used: only the photosensitive pixel area 22 and plurality of first connection terminals 23a are formed on the semiconductor wafer 20 before lamination, the lens array sheet 30 is then laminated to the semiconductor wafer 20, and the second connection terminal 23b, conductor 23c, and ball bump 12 are sequentially formed.

The third embodiment eliminates the need for the substrate 10, which is required in the first and second embodiments. This enables the manufacture process to be further simplified and also enables the formation of a camera module that is thinner than that formed according to the first and second embodiments.

In the first to third embodiments, the image pickup lens 31 may be a plane lens, for example a diffraction lens.

Figure 7:
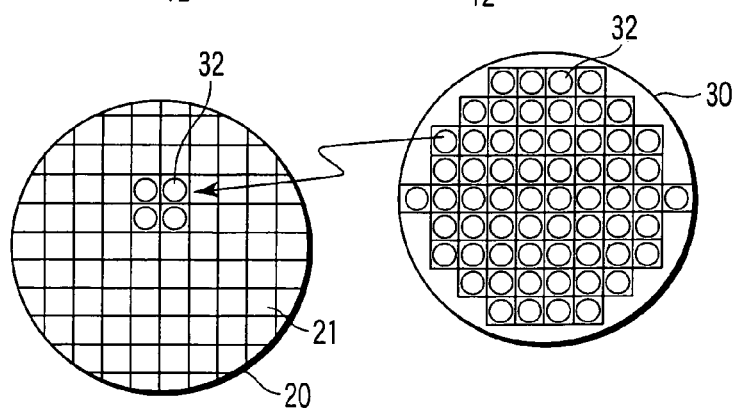
FIG. 7 is a plan view schematically showing a variation of the first to third embodiments.

The first to third embodiments bonds the lens array sheet 30 to the semiconductor wafer 20. However, the present invention is not limited to this. For example, as shown in FIG. 7, the lens array sheet 30 may be cut into pieces having a size equal to that of the chip 21 and corresponding to the respective image pickup lenses 31. The individual lens sheets 32 may be bonded to the respective chips of the semiconductor wafer 20. After the lens sheet 32 is bonded to each chip 21 of the semiconductor wafer 20, a manufacturing process similar to that according to the first to third embodiments is executed. This manufacturing method can make the manufacturing process simpler than the method of assembling all individualized parts as is the case with the prior art. This manufacturing method also enables a reduction in the thickness of the camera module.

In the embodiments, the IR cut filter 33 and shielding film 34 are formed on the front surface of the lens sheet 32, with the shielding film 35 formed on the back surface, as shown in FIG. 3. However, the present invention is not limited to this.

Figure 8:
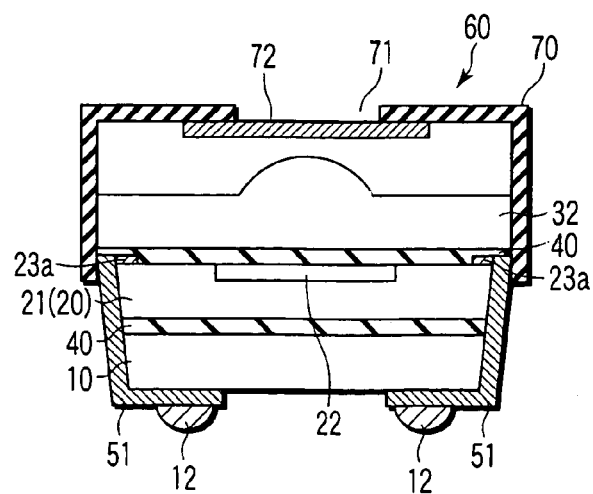
FIG. 8 is a sectional view schematically showing the variation of the first to third embodiments.

FIG. 8 shows a variation of the first to third embodiments which is applied to the second embodiment. In FIG. 8, neither the IR cut filter nor the shielding film are formed on the first or back surface of the lens sheet 32. A holder 70 formed of a shielding material is installed above the camera module 60. An opening 71 is formed at a position corresponding to the image pickup lens 31 of the holder 70. The diameter of the opening 71 is almost equal to or smaller than that of the image pickup lens 31. An IR cut filter 72 is provided so as to close the opening 71. This configuration is effective if it is difficult to form an IR cut filter and a shielding film on the image pickup lens 31. This configuration can produce effects almost similar to those of the first to third embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended and their equivalents.

What is claimed is:

1. An image pickup device comprising:
   a substrate;
   a semiconductor chip provided on the substrate and including a connection terminal and an image pickup portion;
   a lens sheet having a lens portion provided on the semiconductor chip;
   a groove formed at least in the substrate to expose the connection terminal; and
   a conductor pattern formed in the groove, one end of the conductor pattern being electrically connected to the connection terminal,
   wherein the connection terminal is provided on a back surface of the semiconductor chip.

2. The device according to claim 1, further comprising a bonding layer formed between the substrate and the semiconductor chip and between the semiconductor chip and the lens sheet.

3. The device according to claim 1, wherein the bonding layer is an epoxy resin layer.

4. The device according to claim 1, wherein the connection terminal is provided on a front surface of the semiconductor chip, and the groove is formed in the substrate and the semiconductor chip.

5. The device according to claim 1, further comprising a bump formed on the other end of the conductor pattern.

6. The device according to claim 1, further comprising a shielding film provided on the entire lens sheet except the lens portion.

* * * * *